(12) United States Patent
Kitani

(10) Patent No.: US 10,714,190 B2
(45) Date of Patent: Jul. 14, 2020

(54) PAGE BUFFER CIRCUIT AND NONVOLATILE STORAGE DEVICE

(71) Applicant: Powerchip Semiconductor Manufacturing Corporation, Hsinchu (TW)

(72) Inventor: Tomofumi Kitani, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/280,049

(22) Filed: Feb. 20, 2019

(65) Prior Publication Data

US 2020/0160917 A1 May 21, 2020

(30) Foreign Application Priority Data

Nov. 20, 2018 (JP) .................................. 2018-217467

(51) Int. Cl.
| | | |
|---|---|---|
| *G11C 16/04* | (2006.01) | |
| *G11C 16/26* | (2006.01) | |
| *G11C 16/34* | (2006.01) | |
| *G11C 16/10* | (2006.01) | |
| *G11C 16/24* | (2006.01) | |

(52) U.S. Cl.
CPC .......... *G11C 16/26* (2013.01); *G11C 16/0483* (2013.01); *G11C 16/10* (2013.01); *G11C 16/24* (2013.01); *G11C 16/3459* (2013.01)

(58) Field of Classification Search
CPC ..... G11C 16/26; G11C 16/0483; G11C 16/10; G11C 16/24; G11C 16/3459
See application file for complete search history.

(56) References Cited

U.S. PATENT DOCUMENTS

| | | | | |
|---|---|---|---|---|
| 6,735,116 | B2 * | 5/2004 | Lee | G11C 8/12 |
| | | | | 365/185.09 |
| 9,076,546 | B2 * | 7/2015 | Nakayama | G11C 16/26 |
| 9,558,829 | B2 * | 1/2017 | Kim | G11C 16/06 |
| 2019/0157292 | A1 * | 5/2019 | Kim | H01L 27/11582 |

FOREIGN PATENT DOCUMENTS

| | | |
|---|---|---|
| JP | H09147582 | 6/1997 |
| JP | 5678151 | 2/2015 |
| JP | 6114796 | 4/2017 |

\* cited by examiner

*Primary Examiner* — Pho M Luu
(74) *Attorney, Agent, or Firm* — JCIPRNET

(57) ABSTRACT

A page buffer circuit includes a latch circuit that temporarily stores data when data is written in or read out from a memory cell through a bit line, the page buffer circuit is configured using a switched capacitor circuit. The page buffer circuit includes a first capacitor connected to a sense terminal connected to one end of the latch circuit, a second capacitor connected to the bit line, a first switch interposed between the sense terminal and the second capacitor, a second switch interposed between the sense terminal and a supply voltage, a first transistor including a control terminal and a first element terminal connected to both terminals of the first switch in parallel, a second transistor including first and second element terminals connected between a second element terminal of the first transistor and a ground, and a control circuit controlling the first and second switches and the second transistor.

7 Claims, 16 Drawing Sheets

EMBODIMENT

PAGE BUFFER CIRCUIT AND NONVOLATILE STORAGE DEVICE

CROSS-REFERENCE TO RELATED APPLICATION

This application claims the priority benefit of Japan Patent Application No. 2018-217467, filed on Nov. 20, 2018. The entirety of the above-mentioned patent application is hereby incorporated by reference herein and made a part of this specification.

BACKGROUND

Technical Field

The present invention relates to a page buffer circuit for an electrically re-writable nonvolatile storage device such as a flash memory and a nonvolatile storage device including the page buffer circuit.

Description of Related Art

There are known NAND-type nonvolatile semiconductor memory devices in which a plurality of memory cell transistors (hereinafter, referred to as memory cells) are connected between bit lines and source lines in series to constitute a NAND string and realize high integration (see, for example, Japanese Laid-Open No. 9-147582).

FIG. 1 is a block diagram showing the overall configuration of a NAND-type flash EEPROM according to the related art. In addition, FIG. 2 is a circuit diagram showing a configuration of a memory cell array 10 of FIG. 1 and peripheral circuits thereof.

In FIG. 1, the NAND-type flash EEPROM according to the related art is configured to include the memory cell array 10, a control circuit 11 controlling the operation of the memory cell array, a row decoder 12, a high voltage generation circuit 13, a page buffer circuit 14 including a data rewrite and read-out circuit, a column decoder 15, a command register 17, an address register 18, an operation logic controller 19, a data input and output buffer 50, and a data input and output terminal 51.

In the memory cell array 10, a NAND cell unit is configured by connecting a plurality of electrically re-writable nonvolatile memory cells MCene, MCone, MCeno, and MCono (hereinafter, collectively referred to as MC) having a stacked gate structure in series. In each NAND cell unit, a drain side is connected to a bit line BLe or BLo through a selected gate transistor SGDe or SGDo and a source side is connected to a common source line SL through a selected gate transistor SGSe or SGSo. Control gates of the memory cells MC lined up in a row direction are connected to word lines WLe(n) or WLo(n) (collectively referred to as WL) in common, and gate electrodes of the selected gate transistors are connected to selected gate lines SGDe and SGDo which are disposed in parallel with the word lines WL. The range of the memory cell selected by one word line WL is one page which is a unit of writing and read-out. The range of the plurality of NAND cell units NU in the range of one page or an integral multiple thereof is one block which is a unit of data erasure. A page buffer circuit 14A includes a sense amplifier circuit (SA) and a latch circuit (DL) which are provided for each bit line in order to perform data rewrite and read-out in units of pages.

The memory cell array 10 of FIG. 2 has a simplified configuration, and may share a page buffer with a plurality of bit lines. In this case, the number of bit lines selectively connected to the page buffer during a data write or read-out operation is a unit of one page. In addition, FIG. 2 shows the range of a cell array that inputs and outputs data to and from one input and output terminal 51. In order to select the word line WL and the bit line BL of the memory cell array 10, the row decoder 12 and the column decoder 15 are provided. The control circuit 11 performs sequence control of write, erasure, and read-out of data. The high voltage generation circuit 13 controlled by the control circuit 11 generates a raised high voltage and intermediate voltage used for rewrite, erasure, and read-out of data.

The input and output buffer 50 is used to input and output data and to input an address signal. That is, data is transferred between the input and output terminal 51 and the page buffer circuit 14 through the input and output buffer 50 and the data signal line 52. An address signal to be input from the data input and output terminal 51 is held by the address register 18 and transmitted to the row decoder 12 and the column decoder 15 to be decoded. A command for operation control is also input from the data input and output terminal 51. The input command is decoded and held by the command register 17, and thus the control circuit 11 is controlled. External control signals such as a chip enable signal CEB, a command latch enable CLE, an address latch enable signal ALE, a write enable signal WEB, and read-out enable signal REB are taken into the operation logic controller 19, and internal control signals are generated in accordance with an operation mode. The internal control signals are used for control of data latch, transfer, and the like in the input and output buffer 50 and transmitted to the control circuit 11, and thus operation control is performed.

In the NAND-type flash EEPROM, data of one page is written in the memory cell at one time. Here, a program verification process (hereinafter, program verification is also referred to as "verification") is adopted for each bit in order to check whether or not all of the bits have been written. Basically, a verification process is completed on the assumption that all of the bits have passed after exceeding a predetermined threshold voltage Vth. However, in recent flash memories, a pass state is set even when some failed bits are left. This is called "pseudo pass processing" and is used to set a pass in a user mode. This is used when a large number of bits operate under an error checking and correction (ECC) function, and the ECC function of a large number of bits does not cause a problem as a whole even when a pseudo pass of a small number of bits at the time of data rewrite is performed. Note that evaluation may be performed by increasing or decreasing the number of bits of a pseudo pass, or the like when analyzing program characteristics or a fail, and thus it is possible to achieve time reduction and efficiency improvement.

In FIG. 2, a pair of bit lines BLe and BLo are selectively connected to the page buffer circuit 14A through a bit line control circuit 14B. In this case, a bit line selection transistor M30 or M31 and a bit line selection transistor M32 are set to be in an electrically conducting state by the bit line selected signal BLSe or BLSo, and any one of the bit line BLe or the bit line BLo is selectively connected to the page buffer circuit 14A. Note that, while one of the bit lines is selected, the other bit line in a non-selected state is set to a fixed ground potential or a supply voltage potential by bit line non-selected signals BLVe and BLVo, whereby noise between adjacent bit lines is reduced.

The page buffer circuit 14A of FIG. 2 is configured to include a bit line selection transistor M2 for selecting a predetermined bit line, a transistor M3 for applying a predetermined precharge voltage to a bit line, a capacitor C1 for temporarily charging data, and a latch circuit LAT1 for temporarily latching data constituted by a pair of inverters INV1 and INV2.

Incidentally, bit lines BL tend to be longer as a storage capacity of a NAND flash memory increases. Here, a bit line voltage detection circuit includes the bit line control circuit 14B and the page buffer circuit 14A as shown in FIG. 2.

FIG. 3A is a circuit diagram showing the operation of bit line setup in the circuit of FIG. 2, and FIG. 3B is a circuit diagram showing the operation of read-out setup in the circuit of FIG. 2.

FIG. 3A shows a state where the bit line BL is set to a voltage before a data read-out operation. In the example of FIG. 3A, a selected bit line is BLe, and thus the bit line BLo is set to a predetermined voltage V1 through a transistor M1 in order to cancel the selection of the bit line BLo. Since a voltage BLSNS=a precharge voltage Vchg+a threshold voltage (Vt) is applied to a gate of the bit line selection transistor M2, the precharge voltage Vchg is set for the bit line BLe through the transistors M2 and M3. Subsequently, in FIG. 3B showing data read-out, the voltage BLSNS=Vsns+Vt is applied to the gate of the bit line selection transistor M2, and a voltage of data is read out from a predetermined memory cell MC.

FIG. 4A is a circuit diagram related to bit line setup in the circuit of FIG. 2, and FIG. 4B is a timing chart showing a charging time of bit lines in the bit line setup in the circuit of FIG. 2. Here, FIGS. 4A and 4B show difficulty and inconsistency of the setup of bit lines and FIG. 4A simply shows the state of setup of a bit line voltage. The bit line BLe has only a capacity load CBL, and more transistors M2 approach an off state as the voltage of the bit line BLe increases as shown in FIG. 4B. Therefore, a relatively long period of time is required for the bit line BLe to reach a predetermined voltage Vchg, and finally, the bit line BLe is saturated at a voltage slightly lower than a target voltage Vchg due to limitation of a setup time. In addition, threshold values Vt of a plurality of transistors M2 are not actually consistent with each other, and the mismatch affects a precharge voltage level of the bit line BLe.

FIG. 5 is a timing chart showing a read-out operation of a bit line in bit line setup in the circuit of FIG. 2.

In a data read-out operation of FIG. 3B, after the bit line BLe is set up, the transistor M3 is set to be in an off state, and the voltage Vchg is changed to a voltage Vsns. In addition, the selected gate transistors SGDo and SGSo and the transistor of the word line WLo are set to be in an on state for data read-out. As shown in a voltage operation of the bit line BLe of FIG. 5, a configuration in which the latch circuit LAT1 of the inverter is enabled and data from the memory cell MC is latched after a sensing period ($t_{SNS}$) is adopted.

For example, Japanese Patent No. 5678151 and Japanese Patent No. 6114796 disclose a page buffer circuit for an electrically re-writable nonvolatile storage device such as a flash memory.

PATENT DOCUMENTS

[Patent Document 1] Japanese Laid-Open No. 9-147582
[Patent Document 2] Japanese Patent No. 5678151
[Patent Document 3] Japanese Patent No. 6114796

SUMMARY

However, as described above, since data is latched through the bit line selection transistor M2, variations in threshold voltages of the bit line selection transistors M2 corresponding to a plurality of bit lines BL cause variations in data voltages from the memory cells MC due to the bit lines. Thereby, there is a problem in that voltage accuracy of data read-out is lowered.

An objective of the present invention is to solve the above-described problem and provide a page buffer circuit capable of improving voltage accuracy of data read-out as compared with the related art and a nonvolatile storage device using the page buffer circuit.

According to a first aspect of the present invention, there is provided a page buffer circuit including a latch circuit that temporarily stores data when data is written in or read out from a memory cell of a nonvolatile storage device through a bit line, in which the page buffer circuit is configured using a switched capacitor circuit.

In the page buffer circuit, the page buffer circuit may include a first capacitor connected to a sense terminal connected to one end of the latch circuit, a second capacitor including one end connected to the bit line, a first switch interposed between the sense terminal and the other end of the second capacitor, a second switch interposed between the sense terminal and a supply voltage, a first transistor including a control terminal and a first element terminal connected to both terminals of the first switch in parallel, a second transistor including first and second element terminals connected between a second element terminal of the first transistor and a ground, and a control circuit controlling the first and second switches and the second transistor.

Further, in the page buffer circuit, the control circuit (1) may set up read-out of data by turning off the first switch, turning on the second switch, and turning off the second transistor to apply the supply voltage to the first capacitor and apply a voltage higher than a threshold voltage of the first transistor by a predetermined first voltage to the control terminal of the first transistor through the second capacitor from the bit line, (2) may read out data of the memory cell by turning off the first switch, turning off the second switch, and turning off the second transistor to apply a cell current to the memory cell through the bit line from the second capacitor, and (3) may perform control so that a voltage corresponding to the read-out data is set in the first capacitor of the sense terminal and is sample-held by the latch circuit by turning off the first switch turning off the second switch, and turning on the second transistor to apply the voltage corresponding to the read-out data to the control terminal of the first transistor from the second capacitor to which the voltage is applied.

Further, in the page buffer circuit, the control circuit (0) may perform control to set up a sense level by turning on the first switch, turning on the second switch, and turning on the second transistor before setting up read-out of the data to apply a predetermined sense voltage to the bit line.

Further, the page buffer circuit may further include a data transfer circuit which is interposed between the sense terminal and the bit line and performs data read-out during verification by transferring data of the sense terminal to the bit line.

Further, in the page buffer circuit, a memory cell array of the nonvolatile storage device may be separated into at least two memory cell array regions, and a bit line control circuit controlling a voltage of the bit line may be interposed between the separated two memory cell array regions.

According to a second aspect of the present invention, there is provided a nonvolatile storage device including the page buffer circuit.

In the nonvolatile storage device, a first memory cell array region including the bit line control circuit controlling the voltage of the bit line and a second memory cell array region not including the bit line control circuit may be provided in a mixed manner.

Therefore, according to a page buffer circuit of the present invention and a nonvolatile storage device using the page buffer circuit, it is possible to improve voltage accuracy of data read-out as compared with the related art and perform data read-out with a high level of accuracy.

DESCRIPTION OF THE EMBODIMENTS

Figure 1:
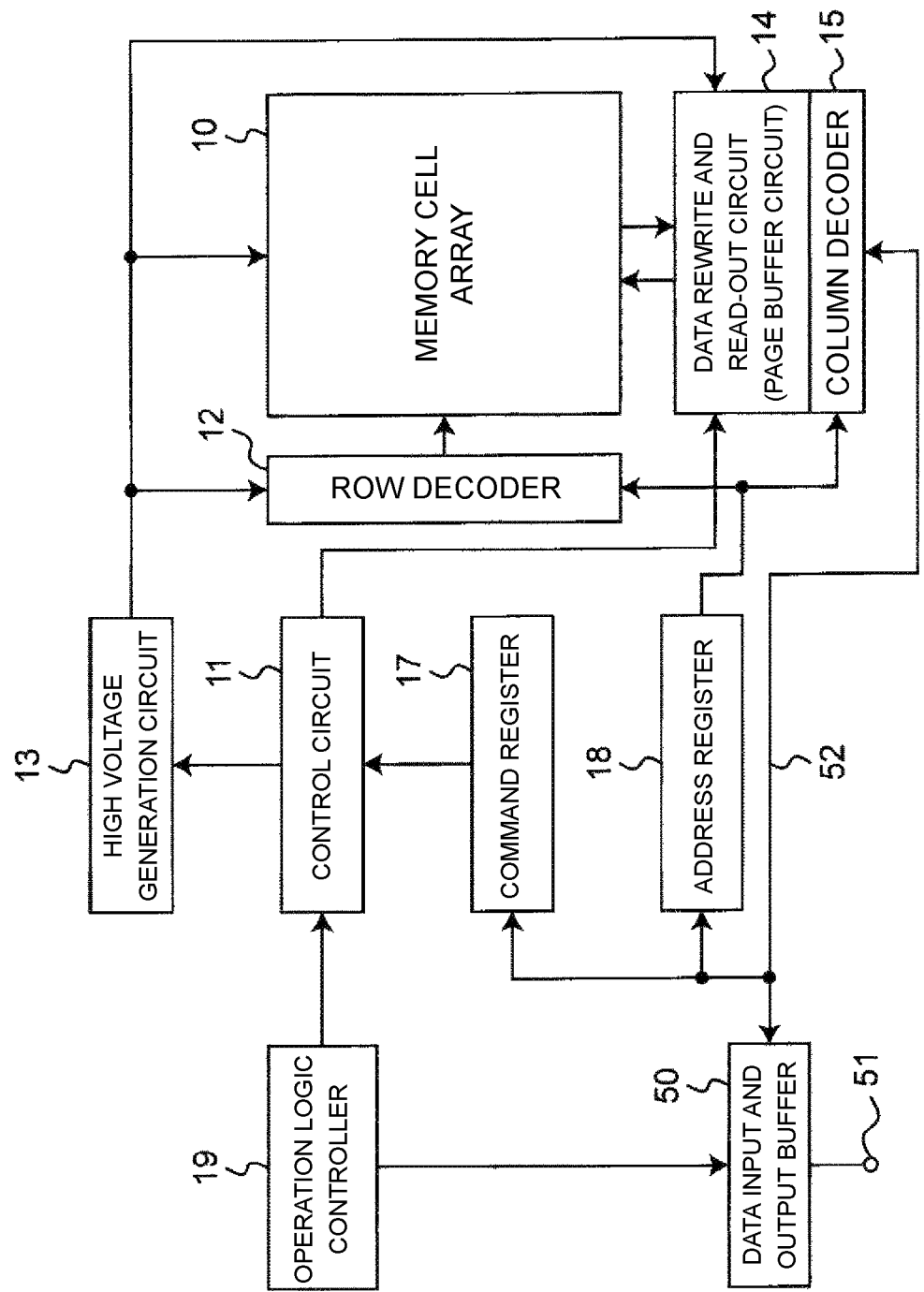
FIG. 1 is a block diagram showing the overall configuration of a NAND-type flash EEPROM according to the related art.

Hereinafter, an embodiment according to the present invention will be described with reference to the accompanying drawings. Note that the same or similar components are denoted by the same reference numerals and signs. In addition, for the sake of description, names of terminals and voltages of terminals may be denoted by the same reference numerals and signs.

Figure 2:
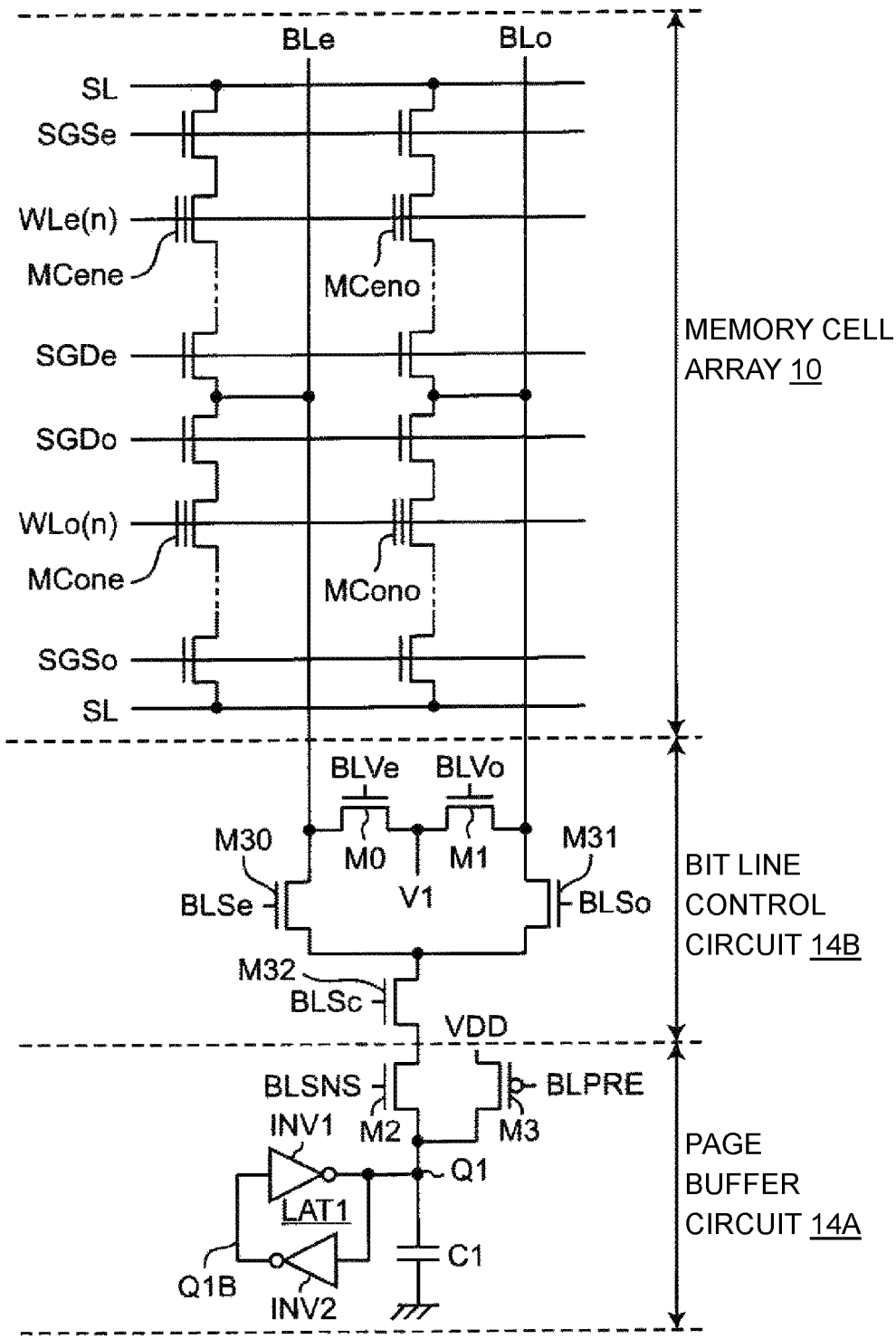
FIG. 2 is a circuit diagram showing a configuration of a memory cell array 10 of FIG. 1 and peripheral circuits thereof.
Figure 3A:
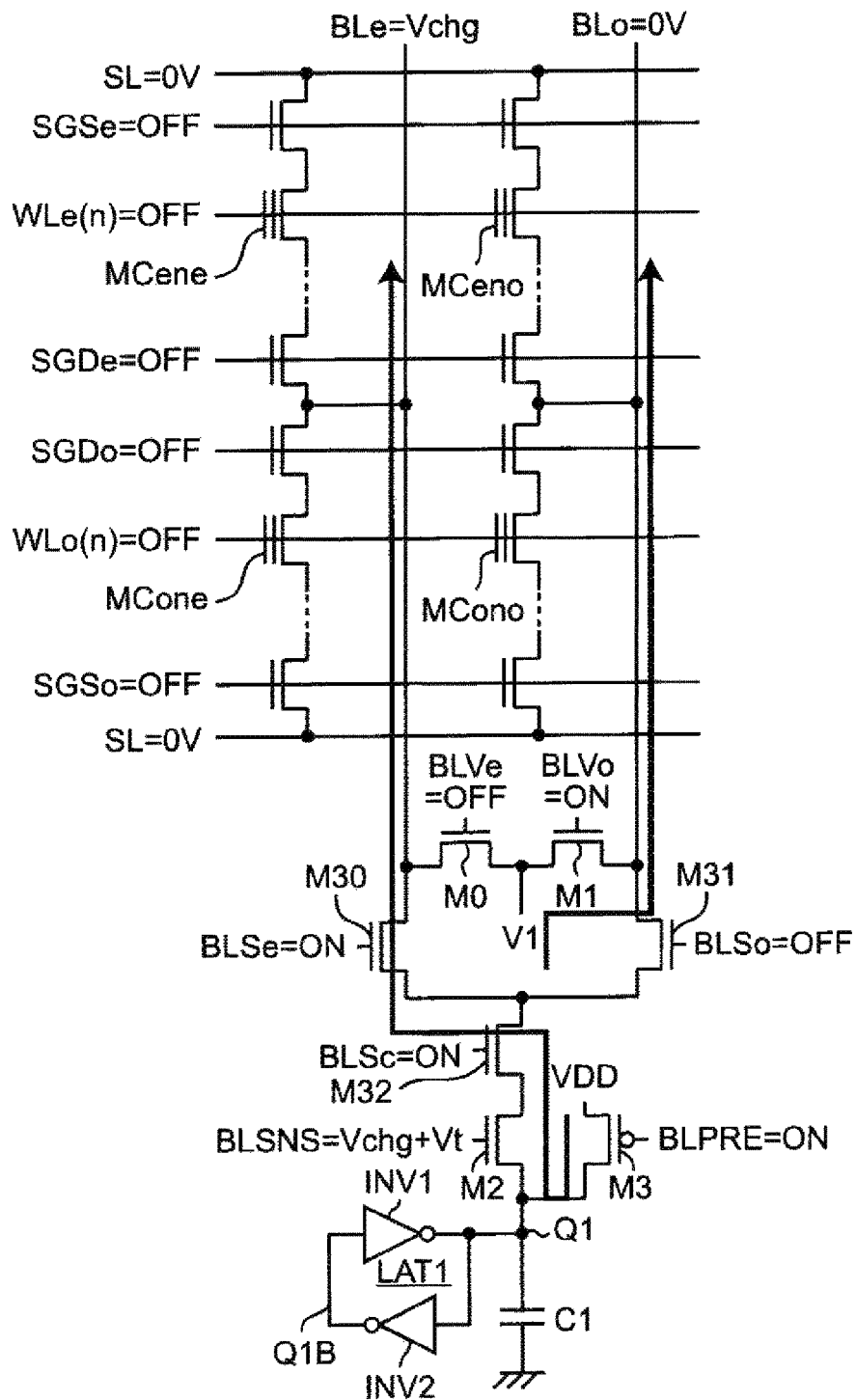
FIG. 3A is a circuit diagram showing the operation of bit line setup in the circuit of FIG. 2.
Figure 3B:
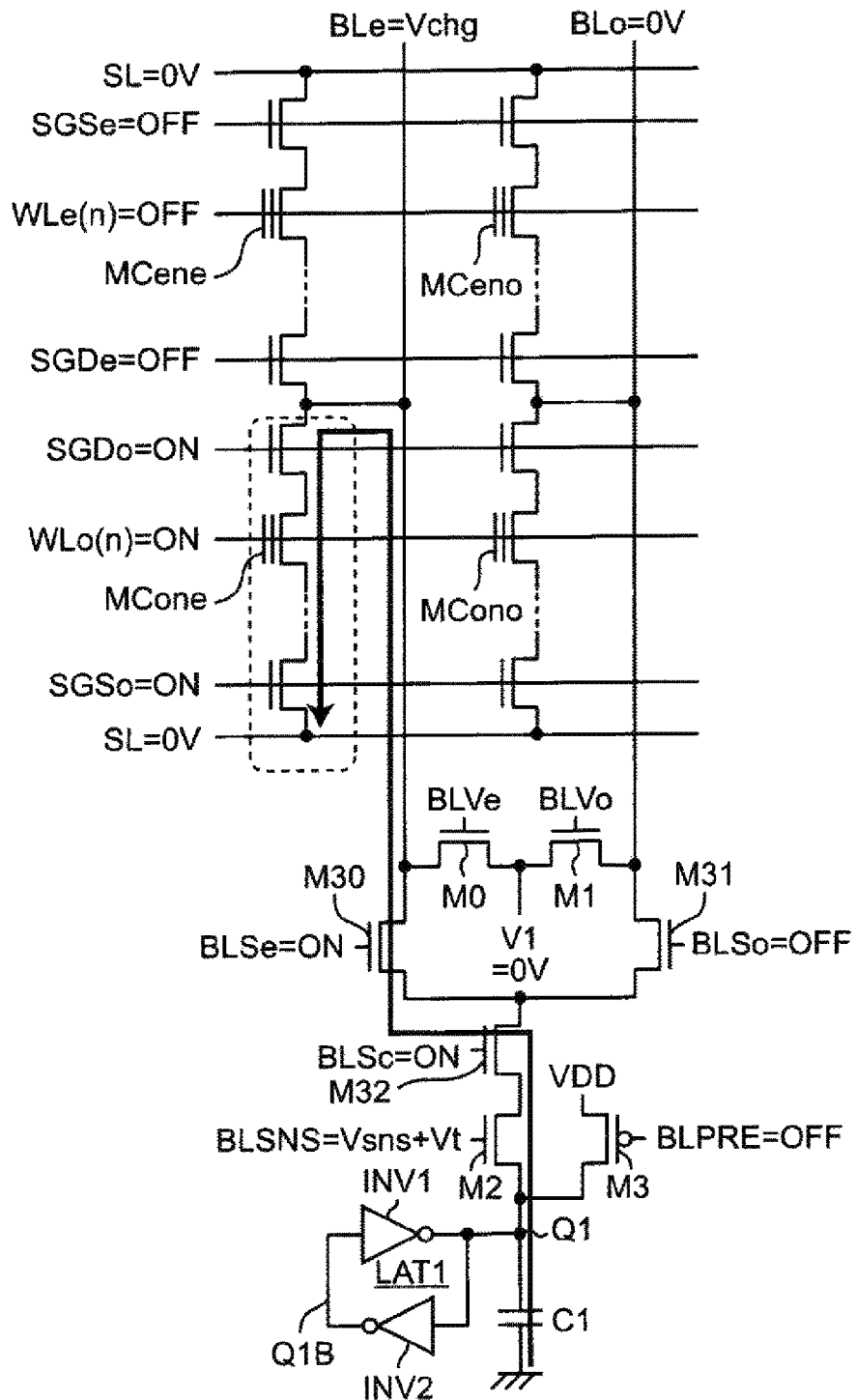
FIG. 3B is a circuit diagram showing the operation of read-out setup in the circuit of FIG. 2.
Figure 4A:
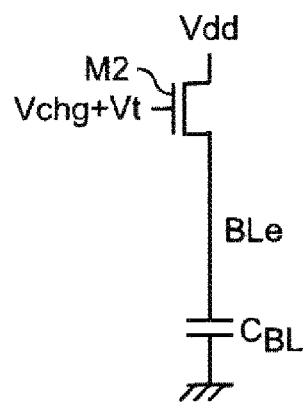
FIG. 4A is a circuit diagram related to bit line setup in the circuit of FIG. 2.
Figure 4B:
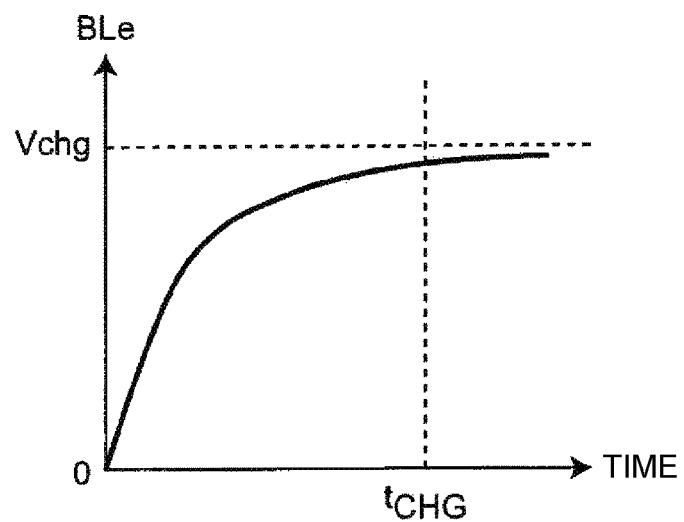
FIG. 4B is a timing chart showing a charging time of bit lines in the bit line setup in the circuit of FIG. 2.
Figure 5:
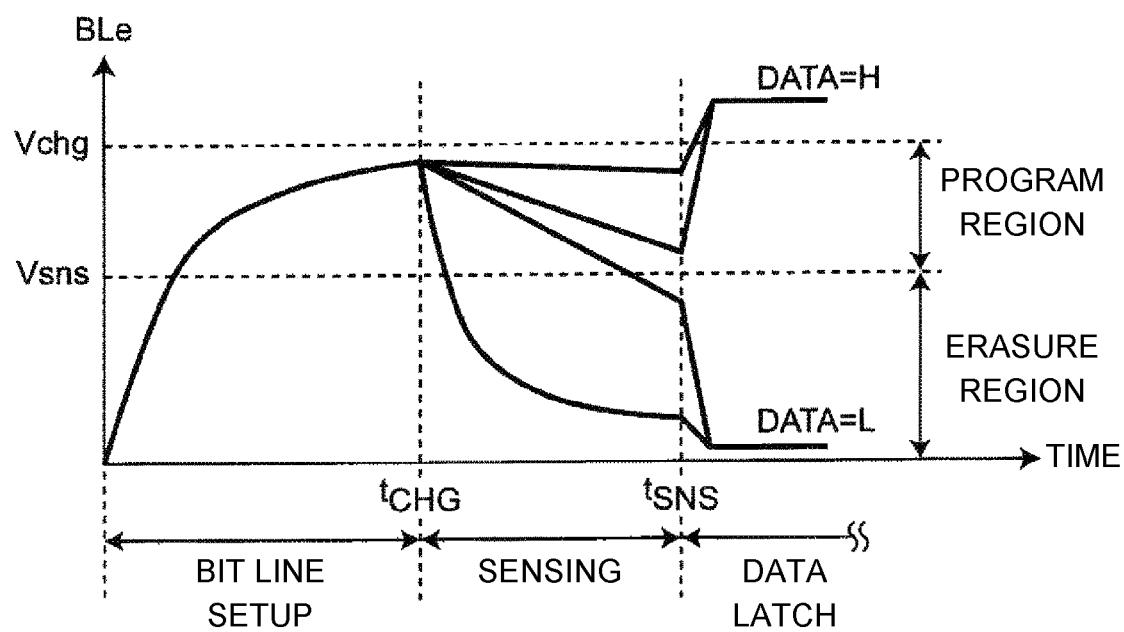
FIG. 5 is a timing chart showing a read-out operation of a bit line in bit line setup in the circuit of FIG. 2.
Figure 6:
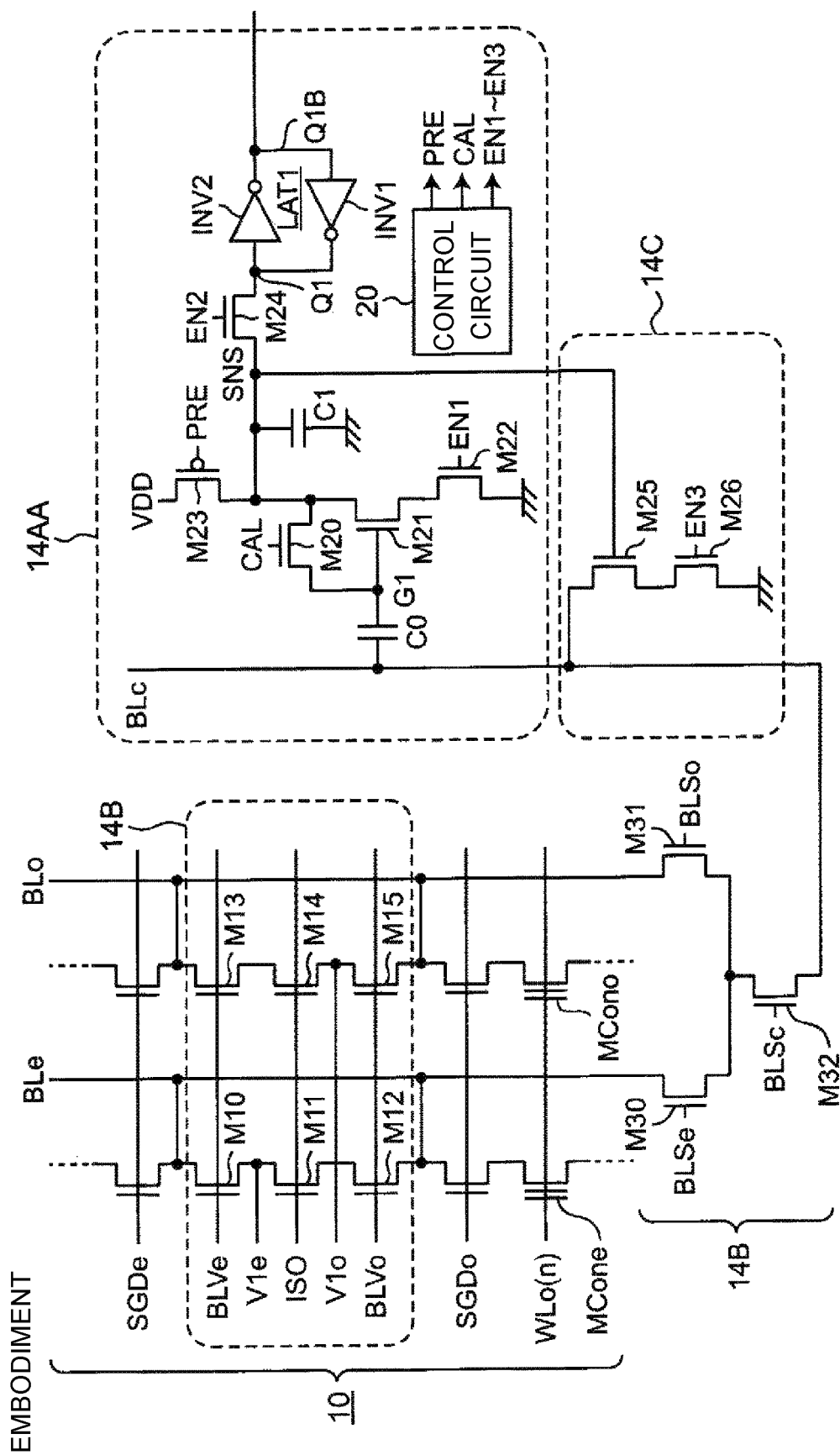
FIG. 6 is a circuit diagram showing a configuration of the memory cell array 10 of the NAND-type flash EEPROM according to the embodiment and peripheral circuits thereof.

FIG. 6 is a circuit diagram showing a configuration of a memory cell array 10 of a NAND-type flash EEPROM according to the embodiment and peripheral circuits thereof. In FIG. 6, the peripheral circuit according to the embodiment is different from a circuit of FIG. 2 in terms of the following respects.

(1) A portion of a bit line control circuit 14B including MOS transistors M10 to M15 is inserted into a region between gate lines of selected gate transistors SGDe and SGDo of the memory cell array 10. A bit line control voltage BLVe is applied to gates of the MOS transistors M10 and M13, a bit line control voltage BLVo is applied to gates of the MOS transistors M12 and M15, and a separation ground voltage ISO for electromagnetically separating two regions is applied to gates of the MOS transistors M11 and M14.

(2) A page buffer circuit 14AA constituted by a switched capacitor circuit is provided.

(3) The page buffer circuit 14AA is connected to the memory cell array 10 through the bit line control circuit 14B and a data transfer circuit 14C. The data transfer circuit 14C is configured to include two MOS transistors M25 and M26 connected to each other in series.

In the page buffer circuit 14AA, variations in threshold voltages of the above-described bit line selection transistors M2 are substantially reduced by using the page buffer circuit 14AA using a switched capacitor circuit, thereby solving a problem that voltage accuracy of data read-out due to the variations in the threshold voltages of the bit line selection transistors M2 is lowered. Thereby, it is possible to set a flexible sensing level. In addition, it is possible to reduce a precharge/discharge period by inserting a portion of the bit line control circuit 14B into a NAND string.

In FIG. 6, the page buffer circuit 14AA is configured to include two capacitors C0 and C1, five MOS transistors M20 to M24, and a latch circuit LAT1 constituted by two inverters INV1 and INV2. Control voltages CAL, G1, EN1, PRE, and EN2 are respectively applied to gates of the MOS transistors M20 to M24 from a control circuit 20, so that turn-on and turn-off of the MOS transistors M20 to M24 are controlled. In addition, one end of the latch circuit LAT1 is set to be a terminal Q1, and the other end thereof is set to be a terminal Q2.

A selected bit line BLc is connected to a sense terminal SNS of the page buffer circuit 14AA through a source and a gate of the MOS transistor M25 of the data transfer circuit 14C. In addition, the selected bit line BLc is grounded through a gate and a drain of the MOS transistor M21 and a source and a gate of the MOS transistor M22 through the capacitor C0. The gate of the MOS transistor M21 is connected to the source of the MOS transistor M21 through a drain and a source of the MOS transistor M20. The source of the MOS transistor M21 is connected to a supply voltage VDD through a drain and a source of the MOS transistor M23 and is grounded through the sense terminal SNS and the capacitor C1. The terminal SNS is connected to the terminal Q1 of the latch circuit LAT1 through a source and a drain of the MOS transistor M24.

For example, when an even-numbered bit line BLe is selected, a voltage V1e supplies a predetermined sense voltage $V_{SNS}+V_{CHG}$ to a bit line BLe through the MOS transistor M10 to store the same charge in the capacitor C0 through one terminal (a terminal on the left side in FIG. 6 and on the bit line BLe side) of the capacitor C0. On the other hand, for example, when an odd-numbered bit line BLo is selected, a voltage V1o supplies 0 V to a bit line BLo through the MOS transistor M15. In addition, the page buffer circuit 14AA reads out data from a memory cell MC and then stores the data in the latch circuit LAT1. Note that the MOS transistor M20 is a MOS transistor for calibrating the potential of the gate voltage G1. In order to supply a sense current $I_{SH}$, the MOS transistor M23 extracts a current from a current source $I_{SH}$ during the setup of a sense level. Subsequently, the MOS transistor M23 is turned on to precharge the sense terminal SNS, and data of the sense terminal SNS is stored in the latch circuit LAT1 after the MOS transistor M24 is turned on after a sample holding period.

Figure 7:
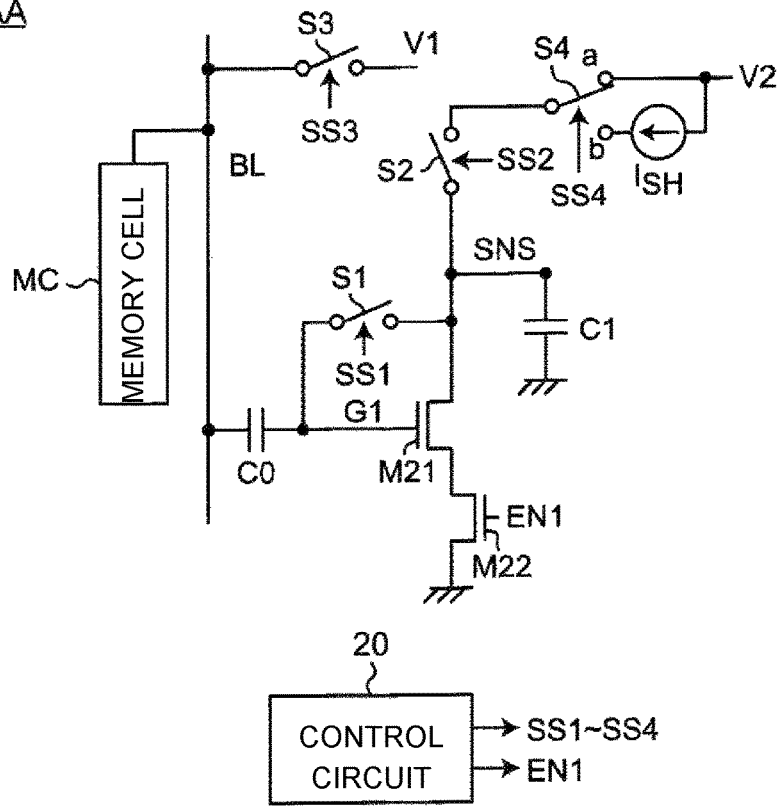
FIG. 7 is a circuit diagram showing a configuration example of a page buffer circuit 14AA using a switched capacitor circuit in the peripheral circuit of FIG. 6.

FIG. 7 is a circuit diagram showing a configuration example of the page buffer circuit 14AA using a switched capacitor circuit in the peripheral circuit of FIG. 6 and is a circuit diagram in which some of the MOS transistors of the page buffer circuit 14AA of FIG. 6 are replaced with switches. In FIG. 7, a switch S1 corresponds to the MOS transistor M20, a switch S2 corresponds to the MOS transistor M23, and a switch S3 corresponds to the MOS transistors M10 and M15. A bit line BL is connected to a voltage V1 through the switch S3. The sense terminal SNS is connected to a common terminal of a switch S4 through the switch S2, a terminal a side of the switch S4 is connected to a voltage V2, and a terminal b side of the switch S4 is connected to the voltage V2 through a current source $I_{SH}$. Turn-on and turn-off of the switches S1 to S4 and the MOS transistor M22 are controlled in accordance with control signals SS1 to SS4 and EN1 received from the control circuit 20.

Figure 8A:
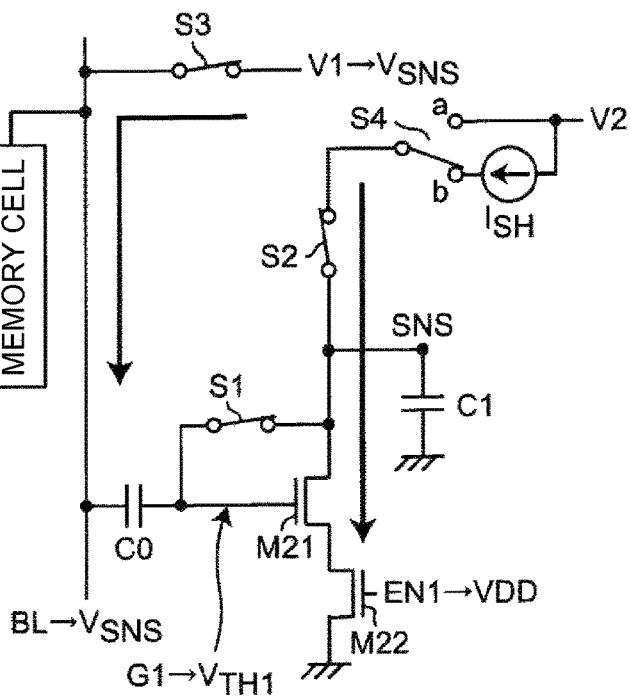
FIG. 8A is a circuit diagram showing operation in a sense level setup mode in the page buffer circuit 14AA of FIG. 7.
Figure 8B:
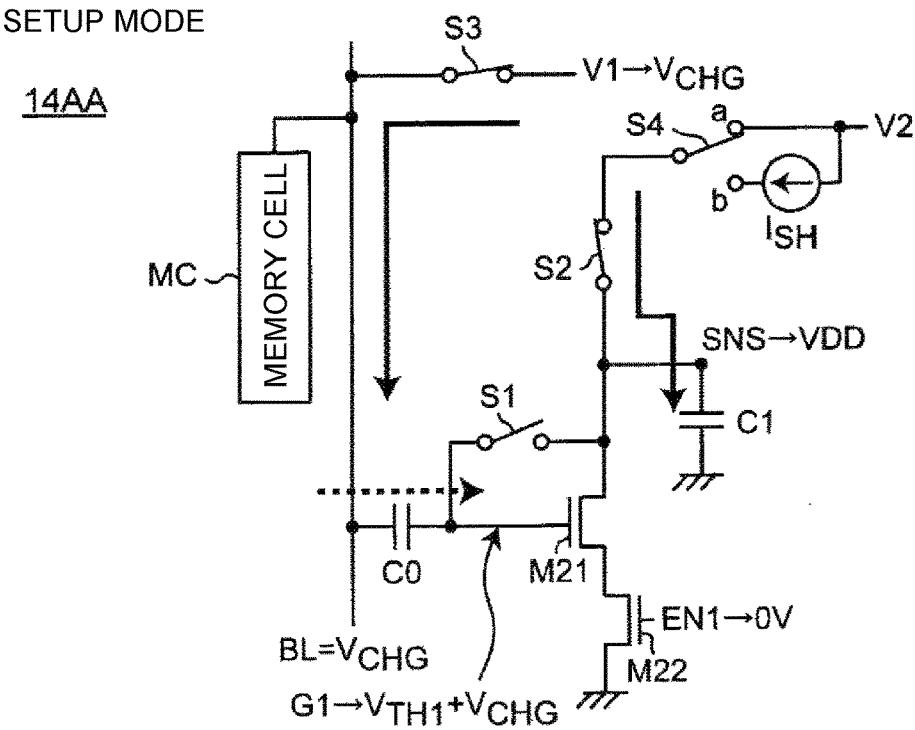
FIG. 8B is a circuit diagram showing operation in a read-out setup mode in the page buffer circuit 14AA of FIG. 7.
Figure 8C:
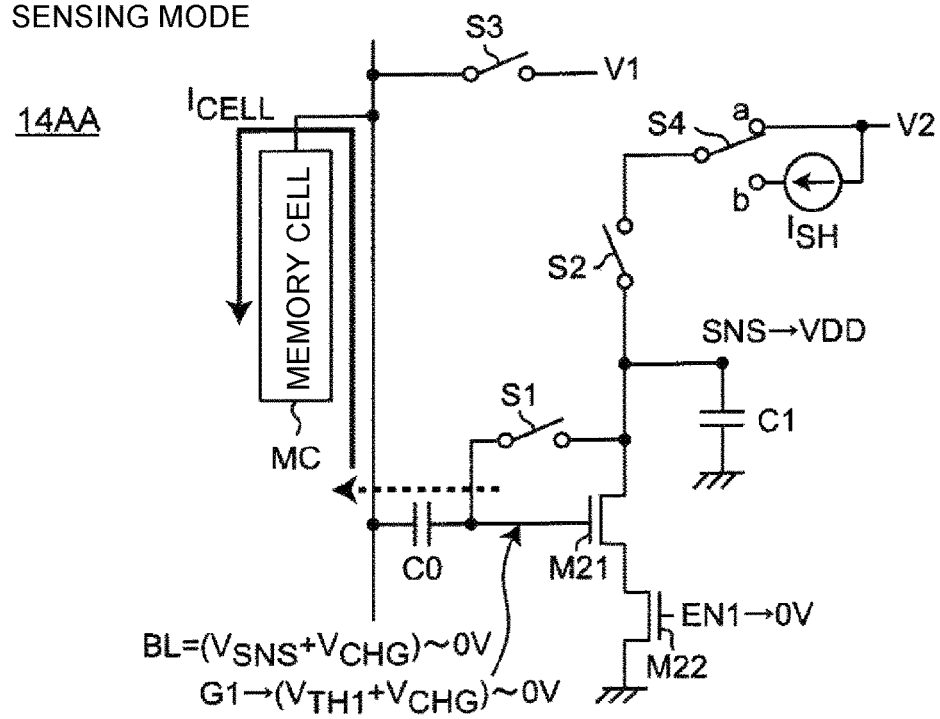
FIG. 8C is a circuit diagram showing operation in a sensing mode in the page buffer circuit 14AA of FIG. 7.
Figure 8D:
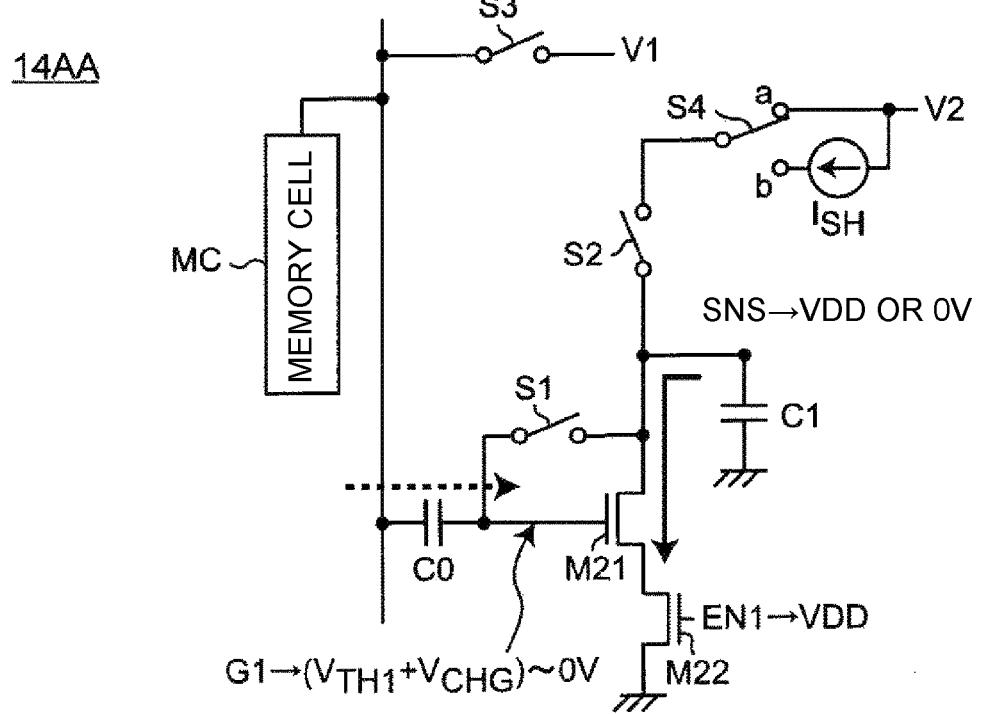
FIG. 8D is a circuit diagram showing operation in a sample holding mode in the page buffer circuit 14AA of FIG. 7.
Figure 9:
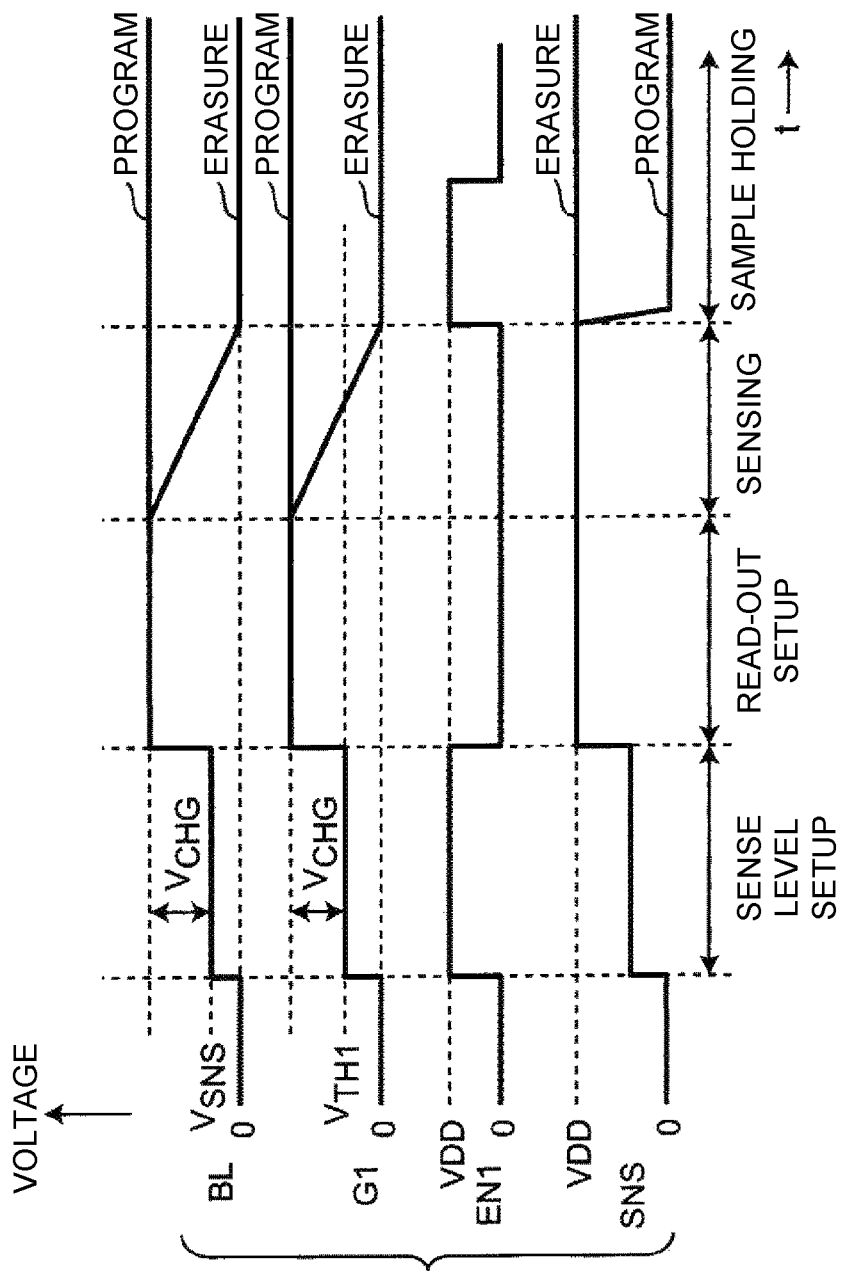
FIG. 9 is a timing chart showing an operation example of the page buffer circuit 14AA of FIG. 7.

FIG. 8A is a circuit diagram showing operation in a sense level setup mode in the page buffer circuit 14AA of FIG. 7, and FIG. 8B is a circuit diagram showing operation in a read-out setup mode in the page buffer circuit 14AA of FIG. 7. In addition, FIG. 8C is a circuit diagram showing operation in a sensing mode in the page buffer circuit 14AA of FIG. 7, and FIG. 8D is a circuit diagram showing operation in a sample holding mode in the page buffer circuit 14AA of FIG. 7. Further, FIG. 9 is a timing chart showing an operation example of the page buffer circuit 14AA of FIG. 7.

Hereinafter, operation of the page buffer circuit 14AA will be described with reference to FIGS. 8A to 9.

A sense level setup mode of FIG. 8A is a period in which a sense level is set in the bit line BL and the gate voltage G1 of the MOS transistor M21. In this case, the switches S1, S2, and S3 and the MOS transistor M22 are turned on, and the switch S4 is switched to the terminal b side. A current from the current source $I_{SH}$ flows through the switches S4 and S2 and the MOS transistors M21 and M22. Thereby, the gate voltage G1 of the MOS transistor M21 is forcibly set to a threshold voltage $V_{TH1}$ of the MOS transistor M21. At the same time, the bit line BL is set to a sense level voltage $V_{SNS}$. Here, since the gate voltage G1 is self-aligned with respect to a plurality of bit lines BL by the current source $I_{SH}$, any voltage can be set as a detection level for the bit line BL.

In a read-out setup mode of FIG. 8B, the switch S1 and the MOS transistor M22 are turned off, and the switches S2 and S3 are turned on. The switch S4 is switched to the terminal a side. Here, the sense terminal SNS is set to the voltage V2 from the supply voltage VDD. At the same time, the bit lines BL is set to an initial voltage $V_{CHG}$ of data read-out from the voltage V1. When the bit line BL is set to the initial voltage VCHG, the potential of the gate voltage G1 of the MOS transistor M21 is set to $V_{TH1}+V_{CHG}$ by charge storage.

In a sensing mode of FIG. 8C, the switches S1, S2, and S3 and the MOS transistor M22 are turned off. At the same time, a selected gate voltage SGDe or SGDo is turned on, so that a predetermined memory cell MC is connected to the bit line BL. In this case, as shown in FIG. 8C, a cell current $I_{CELL}$ is generated, and the charge of the memory cell MC is discharged by the voltage of the bit line BL toward 0 V.

(A) In a case in which the memory cell MC is an erasure cell, the cell current $I_{CELL}$ is set to be sufficiently large to make the voltage of the bit line BL lower than the sense voltage $V_{SNS}$ which is a voltage of the sense terminal SNS, and the gate voltage G1 of the MOS transistor M21 becomes lower than the threshold voltage $V_{TH1}$ thereof.

(B) In a case in which the memory cell MC is a program cell, the cell current $I_{CELL}$ hardly flows, and the voltage of the bit line BL is maintained higher than the sense voltage $V_{SNS}$.

In a sampling holding mode of FIG. 8D, only the MOS transistor M22 is turned on.
(A) In a case in which the gate voltage G1 of the MOS transistor M21 is higher than the threshold voltage $V_{TH1}$, the MOS transistor M21 is turned on. Thereafter, as shown in FIG. 9, the sense voltage $V_{SNS}$ of the terminal SNS is set to 0 V as "program data".
(B) In a case in which the gate voltage G1 of the MOS transistor M21 is lower than the threshold voltage $V_{TH1}$, the MOS transistor M21 is turned off. In this case, as shown in FIG. 9, the sense voltage $V_{SNS}$ of the terminal SNS maintains a predetermined voltage as "erasure data".

According to the page buffer circuit 14AA with a switched capacitor circuit which is configured as described above, variations in threshold voltages of the bit line selection transistors M2 are substantially reduced, and thus it is possible to solve a problem that voltage accuracy of data read-out due to the variations in the threshold voltages of the bit line selection transistors M2 is lowered. Thereby, it is possible to set a flexible sensing level. In addition, it is possible to reduce a precharge/discharge period by inserting a portion of the bit line control circuit 14B into a NAND string.

Subsequently, an embodiment in which a portion of the bit line control circuit 14B is inserted into the memory cell array 10 of FIG. 6 will be described below.

Figure 10:
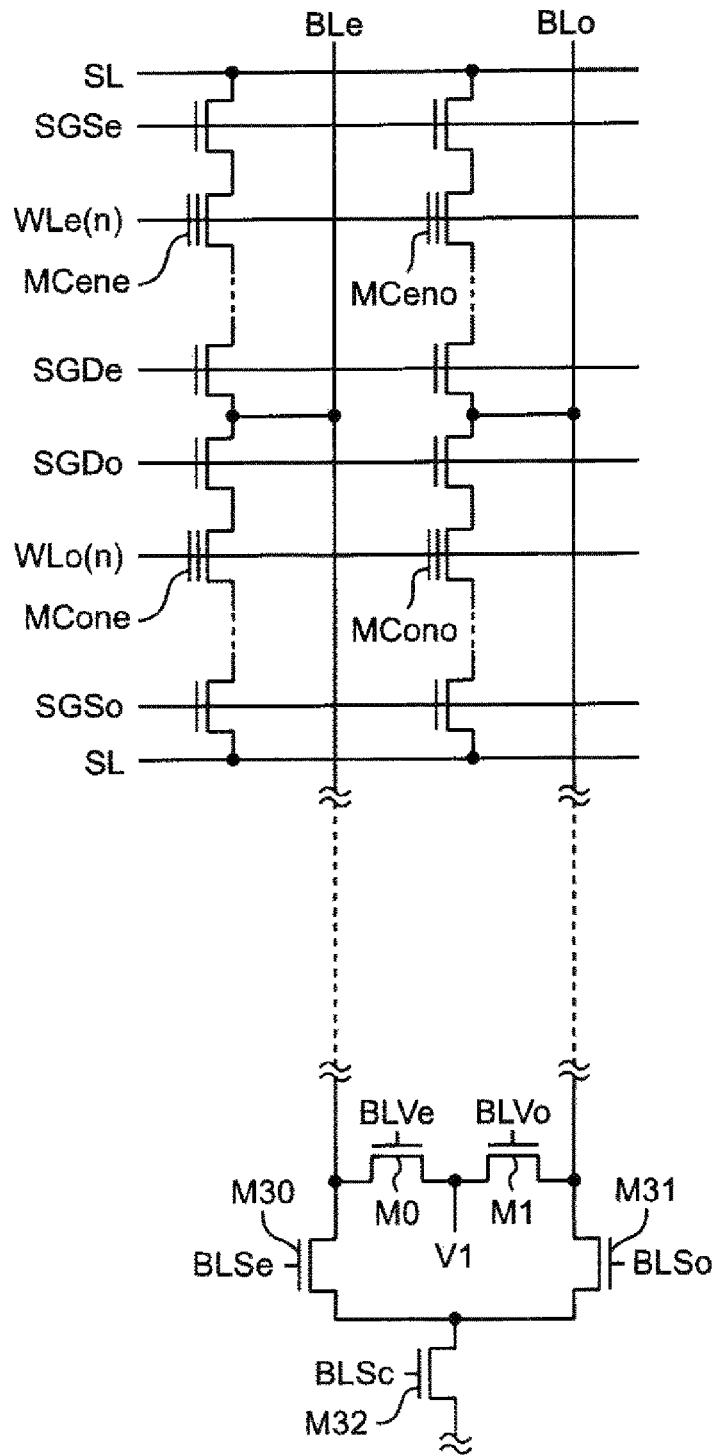
FIG. 10 is a circuit diagram showing a configuration example of a memory cell array type A (10A) according to the related art.

FIG. 10 is a circuit diagram showing a configuration example of a memory cell array type A (10A) according to the related art. The bit line control circuit 14B of FIG. 10 is disposed in a region outside the memory cell array 10 as shown in the related art of FIG. 2 and is called "a type A".

Figure 11:
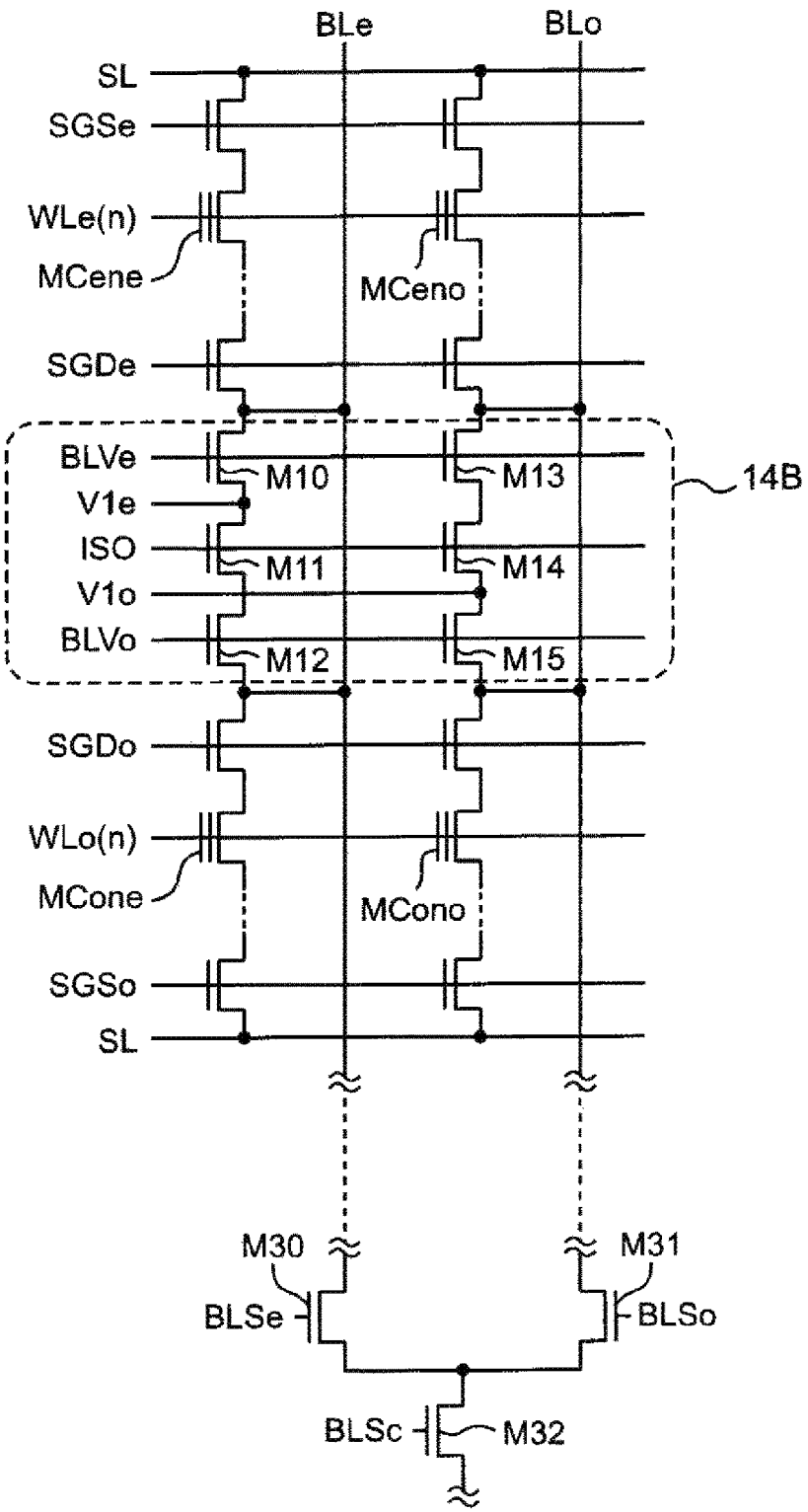
FIG. 11 is a circuit diagram showing a configuration example of a memory cell array type B (10B) according to the embodiment.

FIG. 11 is a circuit diagram showing a configuration example of a memory cell array type B (10B) according to the embodiment. A portion of the bit line control circuit 14B of FIG. 11 is disposed in a region inside the memory cell array 10 as shown in the embodiment of FIG. 6. Specifically, a portion of the bit line control circuit 14B including the MOS transistors M10 to M15 is inserted into a region between gate lines of the selected gate transistors SGDe and SGDo of the memory cell array 10. A bit line control voltage BLVe is applied to gates of the MOS transistors M10 and M13, a bit line control voltage BLVo is applied to gates of the MOS transistors M12 and M15, and a separation ground voltage ISO for electromagnetically separating two regions is applied to gates of the MOS transistors M11 and M14. The arrangement of the bit line control circuit 14B is called "a type B".

In the configuration example of FIG. 11, a voltage V1 is separated into a voltage V1e of an even-numbered bit line BLe and a voltage V1o of an odd-numbered bit line BLo. In addition, the MOS transistors M10 and M15 function as the switch S3 of FIG. 7. The MOS transistors M11 and M14 are set to be in an off state at all times, and the MOS transistors M12 and M13 are dummy MOS transistors for adding up the number of arrays.

Subsequently, a method of using the memory cell array type A (10A) and the memory cell array type B (10B) will be described below.

Figure 12A:
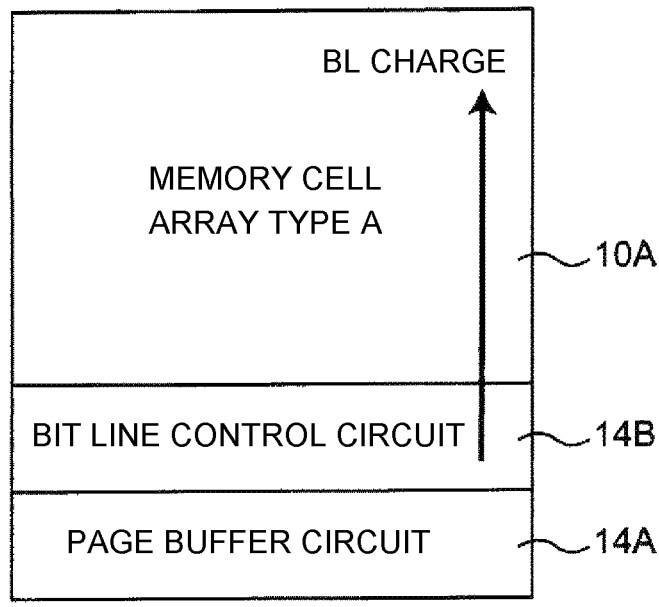
FIG. 12A is a block diagram showing a configuration example of a peripheral circuit according to the related art.

FIG. 12A is a block diagram showing a configuration example of peripheral circuits according to the related art. In the related art of FIG. 12A, the bit line control circuit 14B and the page buffer circuit 14A are disposed in a region outside the memory cell array type A (10A) and the bit line BL of the memory cell array type A (10A) are precharged from the bit line control circuit 14B.

Figure 12B:
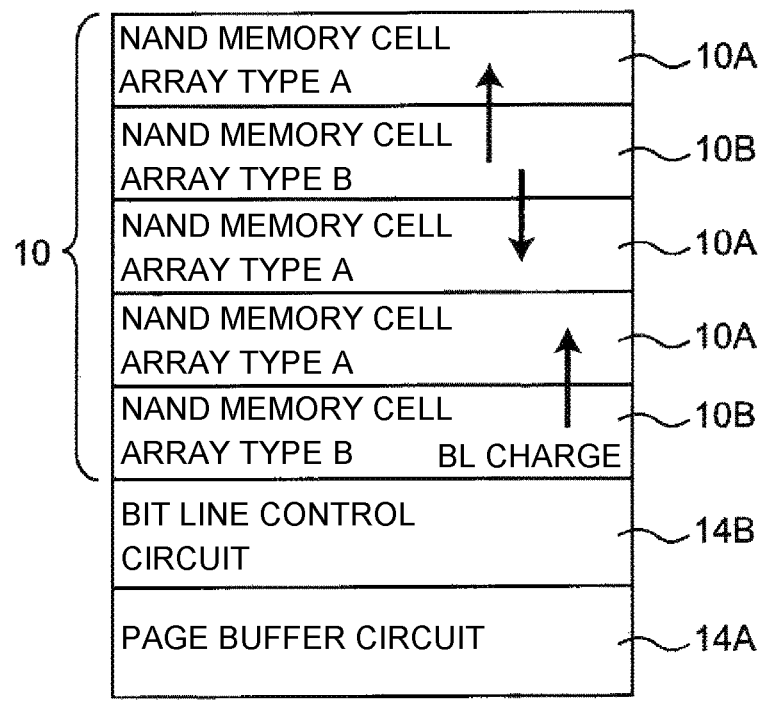
FIG. 12B is a block diagram showing a configuration example of a peripheral circuit according to the embodiment.

FIG. 12B is a block diagram showing a configuration example of peripheral circuits according to the embodiment. In the embodiment of FIG. 12B, a plurality of memory cell array types A (10A) and a plurality of memory cell array types B (10B) are disposed in a mixed manner in the region of the memory cell array 10. Here, the precharging with respect to the bit line BL can be performed from the bit line control circuit 14B within the memory cell array type B (10B) to the memory cell array type A (10A) adjacent thereto.

A bit line charging circuit is disposed in the bit line control circuit 14B and is also disposed in the memory cell array type B (10B) in the embodiment. A load capacity of the bit line BL depends on the length of the bit line, and the length of the bit line related to charging becomes shorter than that in the related art of FIG. 12A by charging the bit line as shown in FIG. 12B, so that it is possible to reduce a precharge/discharge period of the bit line. In addition, it is possible to separately set a selection voltage and a non-selection voltage of the bit line BL for an even-numbered bit line BLe and an odd-numbered bit line BLo in a coercive manner.

Figure 13:
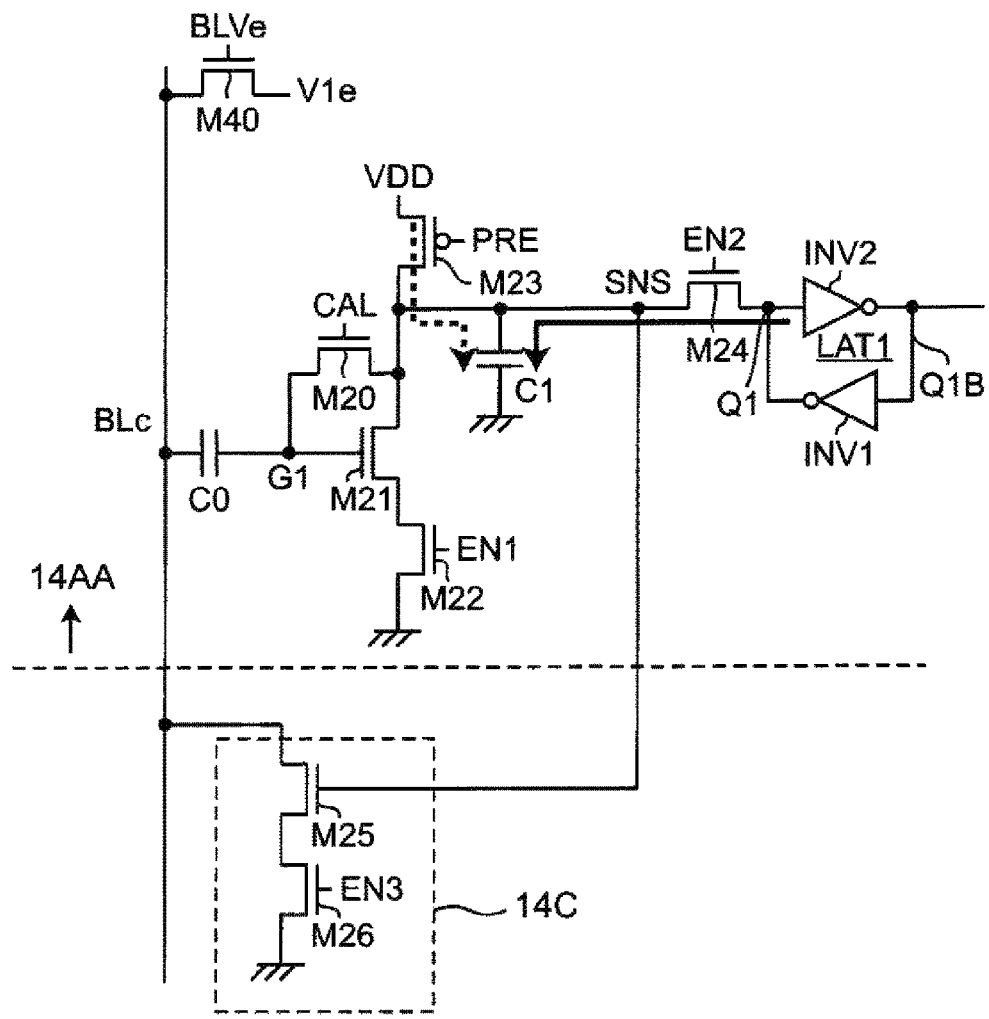
FIG. 13 is a circuit diagram showing operation in a read-out setup mode during verification in peripheral circuits including the page buffer circuit 14AA and a data transfer circuit 14C according to the embodiment.
Figure 14:
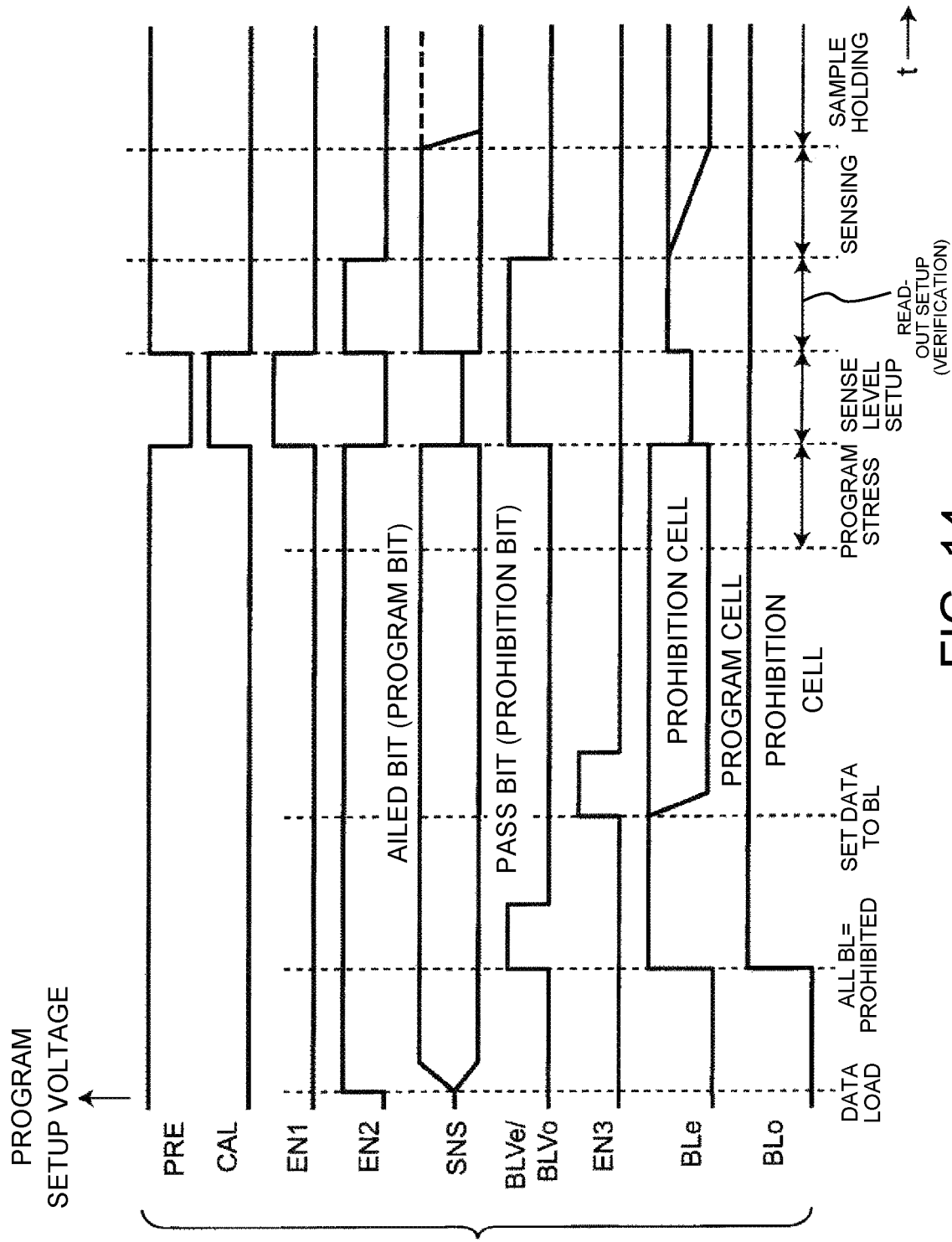
FIG. 14 is a timing chart showing operation in the peripheral circuit of FIG. 13.

FIG. 13 is a circuit diagram showing operation in a read-out setup mode during verification in peripheral circuits including the page buffer circuit 14AA and the data transfer circuit 14C according to the embodiment. In addition, FIG. 14 is a timing chart showing operation in the peripheral circuits of FIG. 13. In FIG. 13, the data transfer circuit 14C constituted by the MOS transistors M25 and M26 is provided.

When operation of the circuits of FIG. 13 is described with reference to FIG. 14, first a voltage of data is uploaded from the latch circuit LAT1 to the sense terminal SNS. The sense terminal SNS is set to an H level in order to program (write) the memory cell MC and is set to an L level in order not to program (write) the memory cell MC. Next, all of the bit lines BL are supplied to the supply voltage VDD through the voltages V1e and V1o in a coercive manner and are set to be in a prohibited state.

Subsequently, the MOS transistor M26 is turned on. When the sense terminal SNS is at an H level, the bit line BL is set to 0 V to program the memory cell MC. After the programming is terminated, the page buffer circuit 14AA shifts to a program verification setup operation. Basically, a program verification process is similar to a data read-out process, and the control voltage EN2 of the MOS transistor M24 is turned off before verification in order to store previous sense data in the latch circuit LAT1.

Next, the page buffer circuit 14AA shifts to "sense level setup". Operation in this case is substantially the same as that of data read-out setup. Regarding a difference from that, in a case of the data read-out setup, the sense terminal SNS is precharged to the supply voltage VDD through the MOS transistor M23 as shown in FIG. 13. On the other hand, the gate voltage EN2 of the MOS transistor M24 is maintained at an H level or an L level instead of a precharge voltage, and the sense terminal SNS is maintained at an H level or an L level in accordance with data of the latch circuit LAT1. When the memory cell MC is sufficiently programmed, the sense terminal SNS is set to an L level. In this case, this is a prohibition bit from the next programming, but the sense terminal SNS is maintained at an H level when the memory cell MC is in an erasure state, and the programming process is terminated.

In the above-described embodiment, a flash memory such as a NAND-type flash EEPROM has been described. However, the present invention is not limited thereto and is applicable to a nonvolatile storage device such as a NOR-type flash memory.

In the embodiment of FIG. 6, the data transfer circuit 14C is provided. However, the present invention is not limited thereto, and the data transfer circuit may not be provided as necessary.

In the above-described embodiment, a gate of each of the MOS transistors M1 to M40 is a control terminal, and a source and a drain thereof can be referred to a pair of element terminals. Here, a configuration using the MOS transistors M1 to M40 is adopted. However, the present invention is not limited thereto, and a configuration using a bipolar transistor may be adopted.

As described above, according to a page buffer circuit for a nonvolatile storage device according to the present invention, it is possible to accurately sense a data value as compared with the related art even when a pitch of a memory cell decreases with miniaturization of a nonvolatile storage device such as a NAND-type flash memory and a transistor size of a peripheral circuit decreases accordingly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A page buffer circuit comprising:
    a latch circuit that temporarily stores data when data is written in or read out from a memory cell of a nonvolatile storage device through a bit line,
    wherein the page buffer circuit is configured using a switched capacitor circuit, and
    the page buffer circuit comprises
    a first capacitor connected to a sense terminal connected to one end of the latch circuit,
    a second capacitor comprising one end connected to the bit line,
    a first switch interposed between the sense terminal and the other end of the second capacitor,
    a second switch interposed between the sense terminal and a supply voltage,
    a first transistor comprising a control terminal and a first element terminal connected to both terminals of the first switch in parallel, a second transistor comprising first and second element terminals connected between a second element terminal of the first transistor and a ground, and a control circuit controlling the first and second switches and the second transistor.

2. The page buffer circuit according to claim 1, wherein the control circuit (1) sets up read-out of data by turning off the first switch, turning on the second switch, and turning off the second transistor to apply the supply voltage to the first capacitor and apply a voltage higher than a threshold voltage of the first transistor by a predetermined first voltage to the control terminal of the first transistor through the second capacitor from the bit line, (2) reads out data of the memory cell by turning off the first switch, turning off the second switch, and turning off the second transistor to apply a cell current to the memory cell through the bit line from e second capacitor, and (3) performs control so that a voltage corresponding to the read-out data is set in the first capacitor of the sense terminal and is sample-held by the latch circuit by turning off the first switch, turning off the second switch, and turning on the second transistor to apply the voltage corresponding to the read-out data to the control terminal of the first transistor from the second capacitor to which the voltage is applied.

3. The page buffer circuit according to claim 2, wherein the control circuit (0) performs control to set up a sense level by turning on the first switch, turning on the second switch, and turning on the second transistor before setting up read-out of the data to apply a predetermined sense voltage to the bit line.

4. The page buffer circuit according to claim 1, further comprising:

a data transfer circuit which is interposed between the sense terminal and the bit line and performs data read-out during verification by transferring data of the sense terminal to the bit line.

5. The page buffer circuit according to claim 1, wherein a memory cell array of the nonvolatile storage device is separated into at least two memory cell array regions, and a bit line control circuit controlling a voltage of the bit line is interposed between the separated two memory cell array regions.

6. A nonvolatile storage device comprising the page buffer circuit according to claim 1.

7. The nonvolatile storage device according to claim 6, wherein a first memory cell array region comprising a bit line control circuit controlling a voltage of a bit line and a second memory cell array region not comprising the bit line control circuit are provided in a mixed manner.

* * * * *